United States Patent [19]
Orlov et al.

[11] Patent Number: 6,108,110
[45] Date of Patent: Aug. 22, 2000

[54] OPTICAL RELAY FOR PIXEL-BASED HOLOGRAPHIC STORAGE AND RETRIEVAL

[75] Inventors: Sergei Orlov, Mountain View; Ray Snyder, San Francisco; Matthew C. Bashaw, San Jose, all of Calif.

[73] Assignee: Siros Technologies, Inc., San Jose, Calif.

[21] Appl. No.: 09/258,162

[22] Filed: Feb. 25, 1999

[51] Int. Cl.[7] ............... G03H 1/26; G03H 1/16; G03H 1/00; G03H 1/12; G11C 13/04
[52] U.S. Cl. ................ 359/22; 359/29; 359/30; 359/11; 365/125
[58] Field of Search ............... 359/10, 11, 22, 359/30, 29, 663; 365/125; 369/112, 103

[56] References Cited

U.S. PATENT DOCUMENTS

| | | | |
|---|---|---|---|
| 3,573,362 | 4/1971 | Burchardt | 178/6.7 |
| 3,657,473 | 4/1972 | Corcoran | 178/6.7 A |
| 3,947,640 | 3/1976 | Ruell et al. | 179/100.3 B |
| 4,045,115 | 8/1977 | Lee | 350/3.5 |
| 5,128,693 | 7/1992 | Tatemichi et al. | 346/108 |
| 5,719,691 | 2/1998 | Curtis et al. | 359/11 |

OTHER PUBLICATIONS

Darskii, A. et al., *Volume holograms with a monodisperse speckle reference wave*, Sov. J. Quantum Electron, 19(5), pp. 688–690, May 1989.

Darskii, A. et al., *Shift selectivity of holograms with reference speckle wave*, Opt. Spectrosc. (USSR) 65(3), pp. 392–395, Sep. 1988.

*Primary Examiner*—Cassandra Spyrou
*Assistant Examiner*—Audrey Chang
*Attorney, Agent, or Firm*—Lumen Intellectual Property Services

[57] ABSTRACT

A holographic storage and retrieval system for use in co-propagating or counter-propagating geometries having a common optical relay for guiding a signal beam and a reference beam along a common optical axis to a holographic medium to write a hologram therein. The optical relay has an object region imaging quality such that at least 65% and preferably at least 80% of the nominal luminous energy from object pixels is encompassed or "ensquared" by the corresponding image pixels. Additionally, the optical relay has a high total numerical aperture (N.A.) of about 0.83, a pixel N.A. of approximately 0.04 for the signal beam. The system of the invention can be used with holographic storage media in the form of disks, tapes or bulk holographic crystals.

39 Claims, 5 Drawing Sheets

OPTICAL RELAY FOR PIXEL-BASED HOLOGRAPHIC STORAGE AND RETRIEVAL

GOVERNMENT RIGHTS CLAUSE

The present invention was made with government support under contract No. MDA-972-95-3-004, awarded by the ARPA/NSIC HDSS Consortium. The government has certain rights in this invention.

FIELD OF THE INVENTION

The present invention relates to the field of holographic data storage, and in particular to an optical relay for guiding the signal and reference beams in a pixel-based holographic storage and retrieval system.

BACKGROUND OF THE INVENTION

In holographic storage systems data is stored as holograms resulting from the interference of a signal and reference beam. During storage, both the reference and signal beams are incident on the storage medium. During retrieval, the reference beam is incident on the medium and the signal beam is not generally incident on the medium. The reference beam diffracts off a stored hologram, generating a reconstructed signal beam proportional to the original signal beam used to store the hologram. Multiple bits are encoded and decoded together in pages, or two-dimensional arrays of bits. Multiple pages can be stored within the volume by angular, wavelength, phase-code, or related multiplexing techniques. Each page can be independently retrieved using its corresponding reference beam. The parallel nature of the storage approach allows high transfer rates and short access times, since a large number of bits within one page can be stored and retrieved simultaneously.

The implementation of holographic storage and retrieval techniques in a commercially viable system will benefit from simple and robust design of the relay optics. Additionally, various media types and geometries, e.g., holographic tape, disk or bulk holographic materials have to be supported by such a system.

One of the proposed approaches for simplifying the optics of a holographic system involves combining the signal and reference beams and passing them substantially along a common optical axis through shared optical elements. Such systems are suitable for the co-propagating geometries where the signal beam, reference beam and also the reconstructed beam all travel in the same general direction along a common optical axis. By virtue of this geometrical arrangement the co-propagating systems are well-suited for use with flat holographic media such as disks or tapes.

In U.S. Pat. No. 4,045,115, Lee describes an optics arrangement for a multi-track holographic tape recorder in which a reference beam may pass through the same series of lenses and directed to the same location in the holographic tape as the signal beam. In Lee's arrangement the signal and reference beams are co-propagating. In U.S. Pat. No. 3,947,640, Ruell et al. teach a method and device for recording data as holograms in a multi-channel storage tape also using a co-propagating geometry. The signal and reference beams are combined in a beam splitter and passed through a common lens directing the beams to the holographic tape medium. Another tape-based holographic system employing the co-propagating signal and reference beam geometry and a shared lens is described in U.S. Pat. No. 3,657,473 by Corcoran. Yet another information recording apparatus taking advantage of the same optics for directing the signal and reference beams to a holographic medium is described by Tatemichi et al. in U.S. Pat. No. 5,128,693. Still another system is taught in U.S. Pat. No. 3,573,362 by Burchardt. This invention describes a co-propagating holographic system where the signal and reference beams are combined and passed through a common mask before impinging on a holographic medium.

Although the above-mentioned holographic systems do provide shared optical elements for guiding the signal and reference beams they are not practical for use in a high-density page-based holographic system.

Pages of holographic data are generally produced with the aid of a spatial light modulator (SLM), which encodes the data in object pixels. For example, in a binary system a light pixel can represent a channel bit of value one and a dark pixels can represent a channel bit of value zero. It is important that the light from each object pixel be properly guided to the medium and, upon reconstruction projected onto the corresponding image pixel of a detection apparatus, e.g., a charge-coupled device (CCD). In other words, the luminous energy emanating from the object pixels has to be appropriately relayed by the optics of the holographic system to the corresponding image pixels. Meanwhile, the quality of transmission of the reference beam is not generally subject to the same quality conditions.

Hence, the prior art solutions do not provide for an effective optical relay for a high-density page-based digital holographic optical storage and retrieval system in a co-propagating geometry.

SUMMARY OF THE INVENTION

Briefly, and in general terms, the present invention provides a holographic storage and retrieval system having an object generator, a reference generator and a holographic medium. The system is of the type where the object beam and the reference beam pass through the same optical relay, e.g. an objective lens. The object generator, e.g. a spatial light modulator (SLM), is positioned in an object region and has object pixels for producing a signal beam. The reference generator, such as a light diffuser positioned in a reference region produces a reference beam. A holographic medium is positioned on an optical axis, as is a detection device used to capture images. The detection device can be a charge coupled device (CCD) or a semiconductor detector array such as a CMOS detector array having image pixels corresponding to the object pixels.

The system has an optical relay for guiding the signal beam and the reference beam along the optical axis to the holographic medium to write a hologram therein. Furthermore, the optical relay is designed to direct to the detection device a reconstructed signal beam produced by the hologram when it is illuminated with the reference beam to the detection device. It is important that the optical relay have an object region imaging quality such that at least 65% and preferably at least 80% of the nominal luminous energy from each object pixel is encompassed or "ensquared" by the corresponding image pixel. For purposes of the invention the energy ensquared by a given image pixel is defined as:

$$\text{Ensquared Energy} = \frac{\int_{\text{image pixel}} I_{\text{object pixel}}(x, y)\, dx\, dy}{\int_{\text{full image plane}} \int_{-\infty}^{\infty} I_{\text{object pixel}}(x, y)\, dx\, dy},$$

where $I_{\text{object pixel}}(x;y)$ is the optical light intensity in the image plane generated by the corresponding object pixel. Thus, ensquared energy does not include light resulting from other pixels.

In a preferred embodiment of the present invention, by way of example and not necessarily by way of limitation, the object region and the reference region are located in a common plane which is orthogonal to the optical axis. In this system the object region is centered on the optical axis, i.e., the SLM producing the image is centered on the optical axis, while the reference region is spaced a certain distance from the optical axis. Furthermore, the object and reference regions should be separated by an intermediate region. Of course, it is also possible to locate the reference and object regions in different planes.

In one embodiment the magnification of the optical relay is one and, correspondingly, the object and image pixels are substantially equal in area. In other systems with oversampling capabilities one object pixel may correspond to more than one image pixel (1:n ratio, e.g., 1:4).

In the preferred embodiment the optical relay system has a high total numerical aperture (N.A.), defined as:

$$N.A. = \sin\left(\frac{D}{2f}\right),$$

where D is the height of the image and f is the effective focal length of the optical relay. For example, the total N.A. of the optical relay is up to 0.83. In this case the numerical aperture for the signal beam is approximately up to 0.43. The remaining aperture is used up by the reference beam.

In a co-propagating arrangement the object and reference generators are located on one side of the holographic medium and the detection device is placed on the opposite sides. The system of the invention is adapted to the counter-propagating geometry when the object generator and reference generator are located on opposite sides of the holographic medium and the detection device is positioned on the same side as the reference generator.

The system of the invention can be used with holographic storage media in the form of disks, tapes or bulk holographic crystals.

The optical relay is a telecentric system providing good distortion control. Preferably, the system is a Fourier relay system, e.g., a 4-f system, centered on or near the storage medium. Of course, positioning the holographic medium in a Fresnel plane and use of an appropriate phase mask is also possible. Furthermore, the optical relay can include a compensating plate to compensate for imaging distortions and for keeping the relay symmetric.

Other features and advantages of the invention will become apparent from the following detailed description, taken in conjunction with the accompanying drawings, which illustrate by way of example the invention.

DETAILED DESCRIPTION

Figure 1:
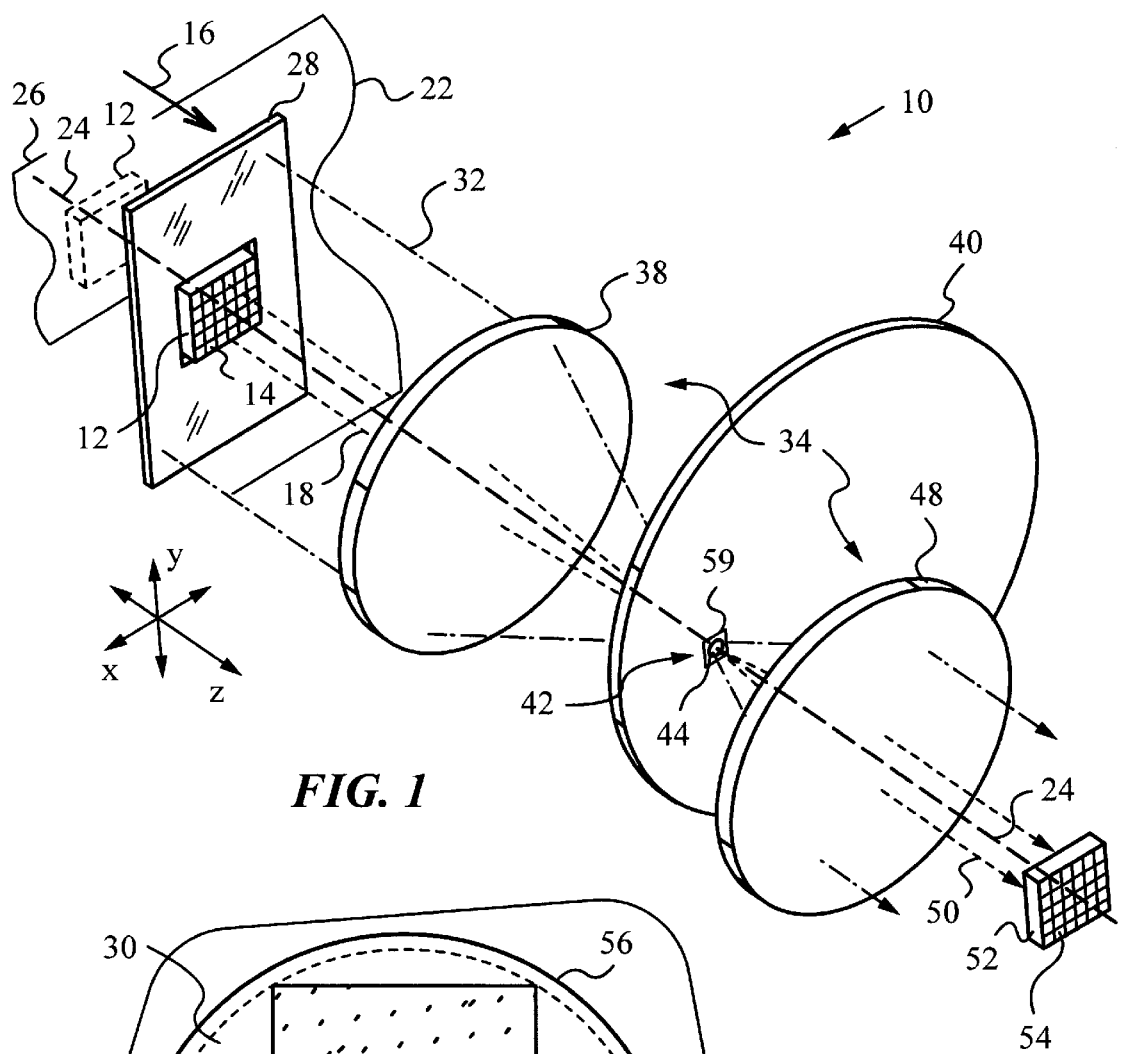
FIG. 1 is an isometric view of a storage and retrieval system according to the invention.

FIG. 1 is an isometric view of a preferred embodiment of a holographic storage and retrieval system 10 according to the present invention. System 10 has an object generator 12, in this case a spatial light modulator (SLM) having object pixels 14. For example, SLM 12 can comprise a 1,024 by 1,024 array of 12 mm square pixels 14 located on a 12.8 mm square grid. SLM 12 is positioned in an object region 20 (see FIG. 2) lying in a plane 22 which is orthogonal to an optical axis 24 of system 10. It should be noted that axis 24 is parallel to the z-axis in the reference system chosen in FIG. 1. SLM 12 is centered on axis 24. As indicated by the dotted lines, it is also possible to position SLM 12 in a different plane 26, also orthogonal to optical axis 24. It is important, however, that SLM 12 be positioned in the path of a light beam 16 which is to be encoded with digital information.

In one embodiment, individual pixels 14 of SLM 12 are rendered transparent or opaque for encoding information. The portion of light beam 16, typically generated by a laser (not shown), which passes through SLM 12 emerges from it as a signal beam 18 impressed with the encoded digital information.

Figure 2:
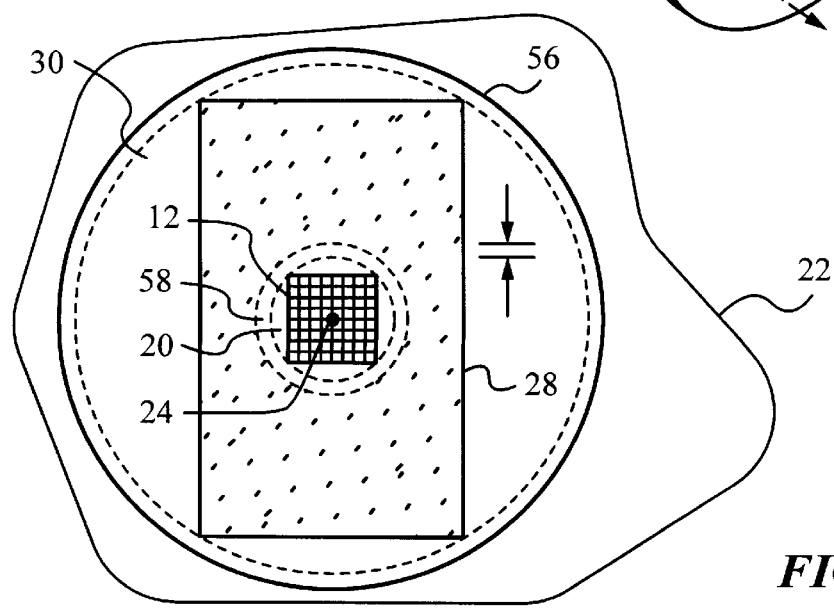
FIG. 2 is a schematic plan view illustrating the arrangement of the object, intermediate and reference regions in the embodiment of FIG. 1.

A reference generator 28 is also positioned in plane 22 in a reference region 30 (see FIG. 2). In this case reference generator 28 is a light diffuser screen or plate which intercepts a portion of beam 16 and turns it into a reference beam 32. Diffuser 28 produces a speckle pattern in reference beam 32 and is thus adapted for shift speckle multiplexing, as described below. Of course, other reference generators can be used depending on the multiplexing scheme selected by the designer. For example, generator 28 can comprise lenses, phase plates or optical systems adapted to shift multiplexing schemes employing elliptical, spherical or cylindrical reference wavefronts. Also, the above manner of generating signal and reference beams 18 and 32 is convenient, but a person skilled in the art will recognize that it is also possible to send separate mutually coherent beams through SLM 12 and diffuser 28 to generate beams 18 and 32.

In this embodiment, signal beam 18 and reference beam 32 co-propagate along optical axis 24 through first optical element 38 of an optical relay 34. Element 38 is a lens for guiding signal and reference beams 18, 32 along axis 24 to a storage medium 40 also located on axis 24. Preferably, the storage medium 40 is a holographic disk whose axis of rotation (not shown) is parallel to optical axis 24. Alternatively, medium 40 is a holographic tape which can, for example, be advanced along the x direction and shifted along the y direction. Preferably, the storage medium material is a photopolymer. In general, however, various storage materials known in the art can be suitable for the present invention, including photopolymers, photosensitive glasses, and photorefractive materials.

Beams 18, 32 are guided to a location 42 in disk 40 where a hologram 44 is stored. Specifically, signal beam 18 interferes with reference beam 32 at location 42 to produce a holographic grating according to known principles. An aperture or Fourier stop 59 is provided at location 42. Stop 59 is a square aperture in a plate (not shown) which is positioned adjacent disk 40.

A lens 48 belonging to optical relay 34 is located on the other side of disk 40. Lens 48 is used during retrieval for guiding a reconstructed signal beam 50, obtained when only reference beam 32 illuminates hologram 44, to a detection device 52. Device 52 is a charge-coupled device (CCD) or a semiconductor detector array, e.g., a CMOS detector array, with image pixels 54. In the present embodiment detector array 52 comprises a 1,024 by 1,024 array of 12.8 mm square pixels 54. Thus, each image pixel 54 on detector array 52 corresponds to one object pixel 14 of SLM 12. Of course, oversampling, i.e., assignment of plural image pixels 54 to a single object pixel 14 or vice versa can also be implemented as required.

Each object pixel 14 produces a nominal intensity or quantity of luminous energy. In other words, each pixel 14 contributes a nominal amount of luminous energy to signal beam 18. In the one-to-one arrangement, where each object pixel 14 is imaged to one image pixel 54, reconstructed signal beam 50 has to be of a sufficient quality to properly image object pixels 14 to image pixels 54 as quantified below.

The schematic view of FIG. 2 illustrates a field of view 56 of relay 34. Field of view 56 encompasses reference region 30 containing diffuser 28, object region 20 containing SLM 12 and an intermediate region 58 around SLM 12. Specifically, the intermediate region 58 is the annular periphery around SLM 12. The width w of region 58 depends on the design of relay 34, on the tolerances of lenses 38 and 48 and the angular selectivity of medium 40 and the optical scatter of the particular holographic material used in medium 40. Region 58 is preferably blocked by a mask such that no portion of beam 16 passes through it. In this manner clear separation is achieved between reference beam 32 and signal beam 18.

Lenses 38 and 48 of relay 34 are designed to have low aberration and low distortion for imaging object region 20 from plane 22 to CCD 54. Preferably, relay 34 has a large acceptance angle or high total numerical aperture (N.A.), defined as:

$$N.A. = \sin\left(\frac{D}{2f}\right),$$

where D is the height of the image and f is the focal length of relay 34. For example, the total N.A. of the optical relay is 0.83. In this case the numerical aperture for signal beam 18 is preferably up to 0.43. In other words, object region 20 falls within N.A.$\leq$0.43. The remaining aperture, i.e. from 0.43 up to 0.83 is used up by reference beam 32. Of course, some aperture between signal beam 18 and reference beam 32 is unused due to the presence of intermediate region 58.

Lenses 38 and 48 of relay 34 are designed for high quality imaging of the light emanating from object region 20 within N.A.$\leq$0.43. In addition, it is desirable that each object pixel 14 fall within a specific pixel N.A. of relay 34, where pixel N.A. is defined as:

$$pixel\ N.A. = \sin\left(\frac{S}{2f}\right).$$

In this equation S is the size of Fourier stop 59. Pixel N.A. defines the collection angle of light emanating from an individual pixel 14. In particular, it is preferred that pixel N.A.$\approx$0.04 for each pixel 14. The imaging quality of reference beam 32 can be lower.

The imaging quality for object region 20 is such that at least 65% of the nominal luminous energy of each object pixel 14 falls on or is "ensquared" by corresponding image pixel 54. Most preferably, at least 80% of the nominal luminous energy from each object pixel 14 is ensquared by the corresponding image pixel 54.

Figure 3:
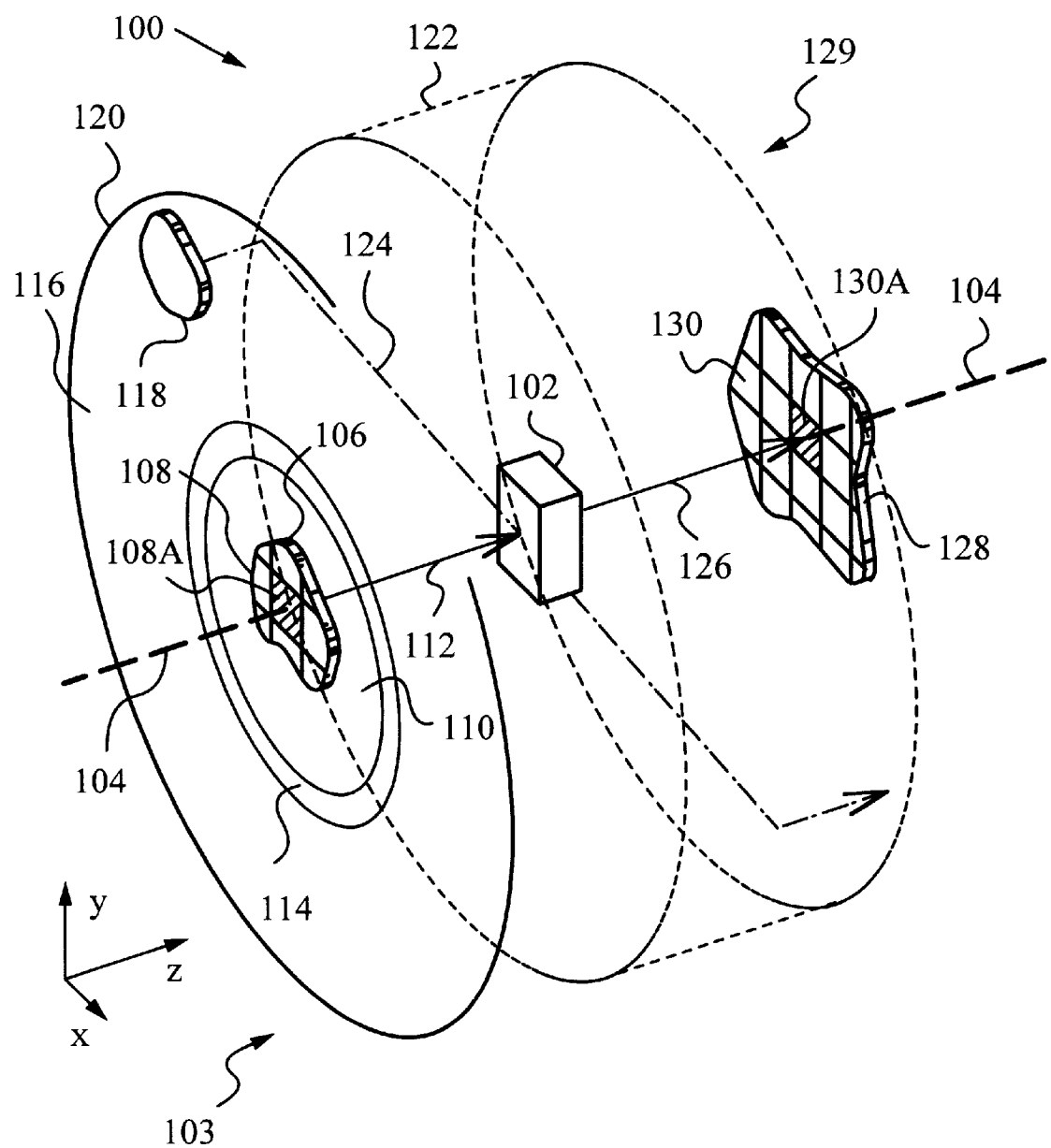
FIG. 3 is a schematic illustration of the general imaging requirements for an optical relay according to the invention.

The requirements placed on an optical relay according to the invention and the definition of ensquared energy or intensity will be best understood by considering the schematic shown in FIG. 3. It should be kept in mind, that this schematic does not necessarily describe the propagation of light waves but illustrates some important aspects of the invention.

In a generalized storage and retrieval system 100 a storage medium 102 is positioned on optical axis 104. An object generator 106 (only a portion shown) placed within an object region 110 has object pixels 108 and a particular one object pixel 108A emits a signal beam portion 112. Beam portion 112 contributes a nominal luminous energy to the total signal beam (not shown).

An intermediate region 114 separates object region 110 from a reference region 116. No light issues from intermediate region 114.

A reference generator of which only a portion 118 is shown in the drawing is positioned in reference region 116. A reference beam portion 124 is emitted from reference generator portion 118 and contributes to the total reference beam (not shown). Both reference generator 118 and object generator 106 are within a field of view 120 of an optical relay 122 indicated in dashed lines. It should be noted that object generator 106 and reference generator 118 do not have to be positioned in the same plane, although in the schematic they are both located in a common object plane 103.

Beam portion 112, representing object pixel 108, propagates through relay 122 to medium 102 where a hologram of pixel 108 is recorded through interference with the reference beam. During retrieval the reference beam illuminates medium 102 and the hologram of object pixel 108 is reconstructed in signal beam portion 126 of the total reconstructed signal beam (not shown) Reconstructed signal beam portion 126 propagates through relay 122 and impinges on detection device 128 positioned in an object plane or detector plane 129.

Preferably, system 100 is a one-to-one system meaning that detection device 128 has a number of image pixels 130 equal to the number of object pixels 108. Thus, object pixel 108A is imaged to one image pixel 130A.

At least 65%, and preferably at least 85% of the nominal luminous energy of object pixel 108A has to be ensquared by image pixel 130A. This means that all optical perturbations (e.g., aberration, distortion etc.) introduced by relay 122 to signal beam portion 112 and reconstructed signal beam portion 126 have to satisfy the requirement that the total integrated luminous energy or intensity scattered by relay 122 out of the image core be less than 35% and preferably less than 20% of the nominal luminous energy.

For purposes of the invention the energy ensquared by image pixel 130A is defined in terms of light intensity as follows:

$$\text{Ensquared Energy} = \frac{\int_{\text{image pixel}} I_{\text{object pixel}}(x; y) \, dx \, dy}{\int_{\text{full image plane}} \int_{-\infty}^{\infty} I_{\text{object pixel}}(x; y) \, dx \, dy}.$$

In this equation $I_{\text{object pixel}}(x; y)$ describes the nominal luminous energy or light intensity generated by object pixel 108A in image plane 129. The integral in the numerator represents the light intensity incident on image pixel 130A and the integral in the denominator represents the total light intensity in image plane 129 generated by object pixel 108A.

Reference beam portion 124 propagating through relay 122 is not subject to the same conditions as signal beam portion 112 and reconstructed signal beam portion 126. Specifically, it is only important for reference beam portion 124 to be accurately guided together with the remainder of the reference beam to medium 102. Thus, the image of reference beam portion 124 in the plane of detection device 128 does not need to satisfy the above ensquared energy condition. The quality of the reference beam, however, does depend on the type of multiplexing. Thus, in general, a telecentric relay system providing good distortion control and not necessarily having a 1:1 magnification can be used. A person of average skill in the art will be able to design the appropriate optical relay based on these technical requirements.

A person of average skill in the art will also realize, that a practical optical relay should have many degrees of freedom and wide mechanical tolerances. These goals can be achieved by optical relays made up of a plurality of lenses. In fact, a particularly flexible relay 150 offering the designer many degrees of freedom and wide mechanical tolerances is shown in a cross sectional view in FIGS. 4A and 4B.

Relay 150 is a Fourier relay with a 1:1 magnification and comprises a first lens set 152A and a corresponding second lens set 152B. Lens sets 152A, 152B are symmetric and centered on a holographic medium 154, in this case a disk, such that a Fourier plane 155 of relay 150 runs through the center of medium 154. Each lens set 152A, 152B includes six lenses. Specifically, each lens set has a plano-convex lens 174, a meniscus lens 176, a biconvex lens 178, and three meniscus lenses 180, 182 and 184. Each lens can offers the designer 3 spatial degrees of freedom and 1 degree of freedom in choosing the refractive index of the lens material. Thus, lens set 152A has a maximum number of 24 degrees of freedom. In the present embodiment the refractive material of all lenses is the same. Hence, lens set 152A actually has 18 degrees of freedom.

An SLM 156 is centered on the optical axis of relay 150 and within N.A.≦0.43 of relay 150. A beam splitter 160 is interposed between relay 150 and SLM 156 for delivering a light beam 162 to SLM 156. A compensating plate 173 is positioned on the other side of Fourier plane 155 with respect to holographic disk 154. Plate 173 may be required in optical relay 150 to compensate for imaging distortions and aberrations and to preserve the symmetry of relay 150. Compensating plate 173 should have the same thickness and average index of refraction as holographic medium 154, and be of sufficiently high optical quality to avoid optic wavefront perturbations. Also, a Fourier stop 159 is provided next to the storage location in disk 154.

Figure 4A:
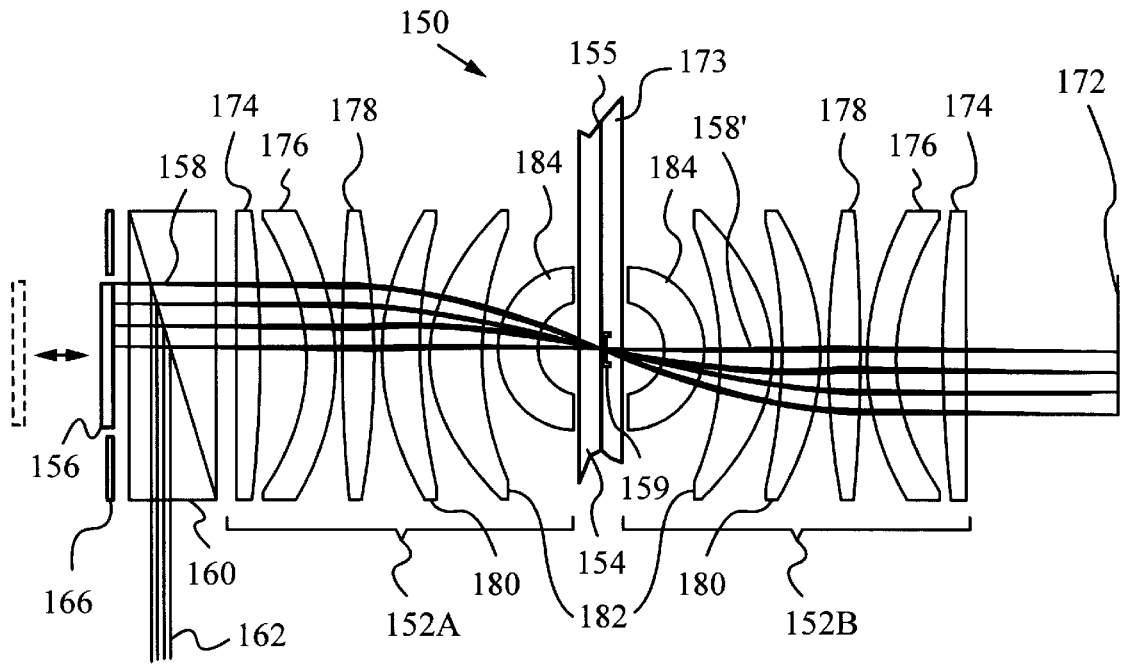
FIG. 4A is a cross section of a preferred optical relay according to the invention relaying the signal beam.

As indicated in FIG. 4A, SLM 156 generates a signal beam 158 by setting its object pixels (not shown) to reflect or absorb the light of beam 162. In the drawing only four rays issuing from four object pixels are traced for reasons of clarity. For adjustment purposes SLM 156 can be displaced as indicated by the arrows.

Figure 4B:
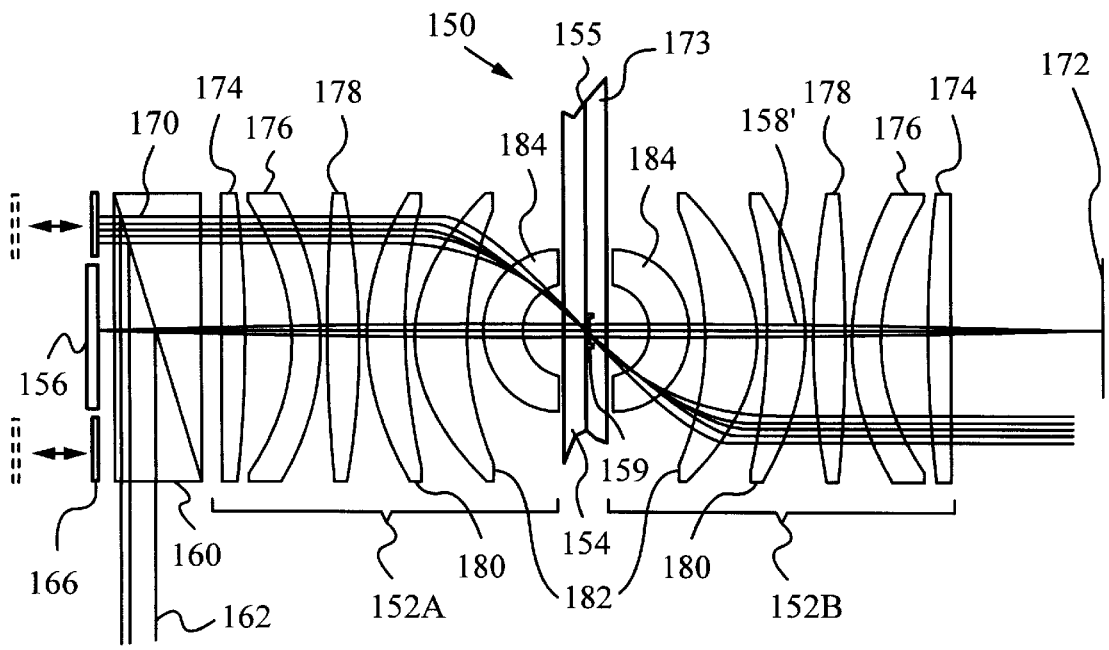
FIG. 4B is a cross section of the optical relay of FIG. 4A relaying the reference beam.

In FIG. 4B diffuser 166 is shown generating a reference beam 170 by reflecting the light of beam 162. Diffuser 166 is located within 0.83≧N.A.>0.43 of relay 150. Only four rays of reference beam 170 are traced for reasons of clarity. For multiplexing purposes, e.g., shift speckle multiplexing, diffuser 166 can be displaced as indicated by the arrows. It is also possible to rotate diffuser 166 around the optical axis of system 150 to achieve shift speckle multiplexing. Alternatively, medium 154 can be moved to decorrelate the speckle pattern at the recording location so that another hologram can be stored.

A CCD 172 is placed in the image plane on the right of relay 150 for intercepting reconstructed signal beam 158'. The number of image pixels (not shown) in CCD 172 is the same as the number of object pixels in SLM 156.

Writing holograms in the Fourier plane may present problems because of the high intensity central Fourier peak focused in medium 154. This problem can be avoided by moving or shifting medium 154 outside Fourier plane 155 along the z direction. Alternatively, a phase mask may be used to eliminate the central Fourier peak.

Figure 5A:
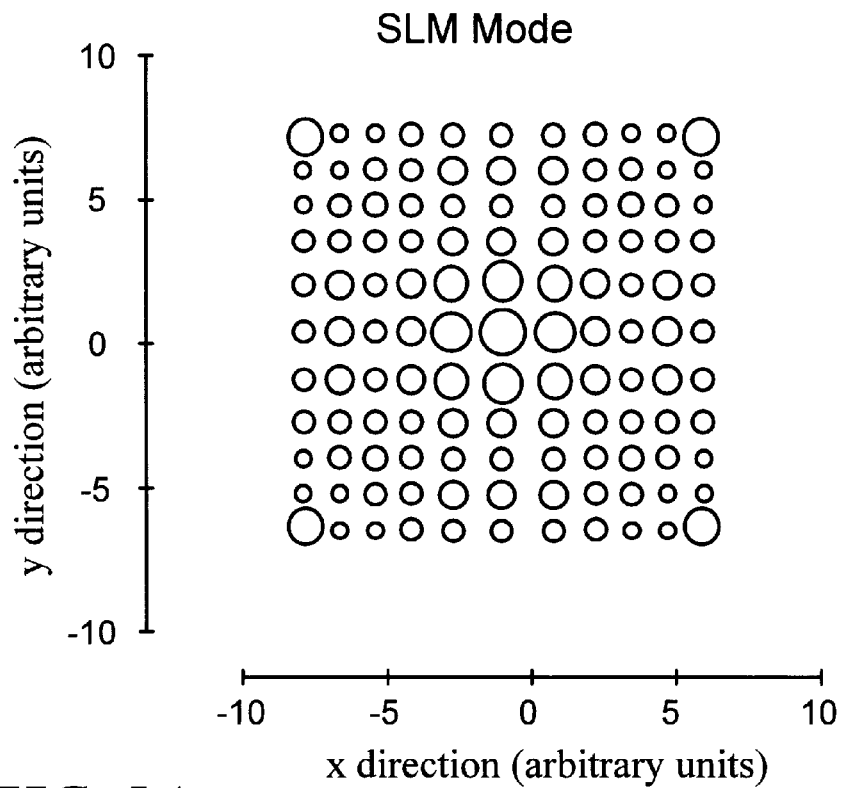
FIG. 5A is a diagram showing RMS wavefront error vs. object height for the signal beam for the optical relay of FIGS. 4A and 4B.
Figure 5B:
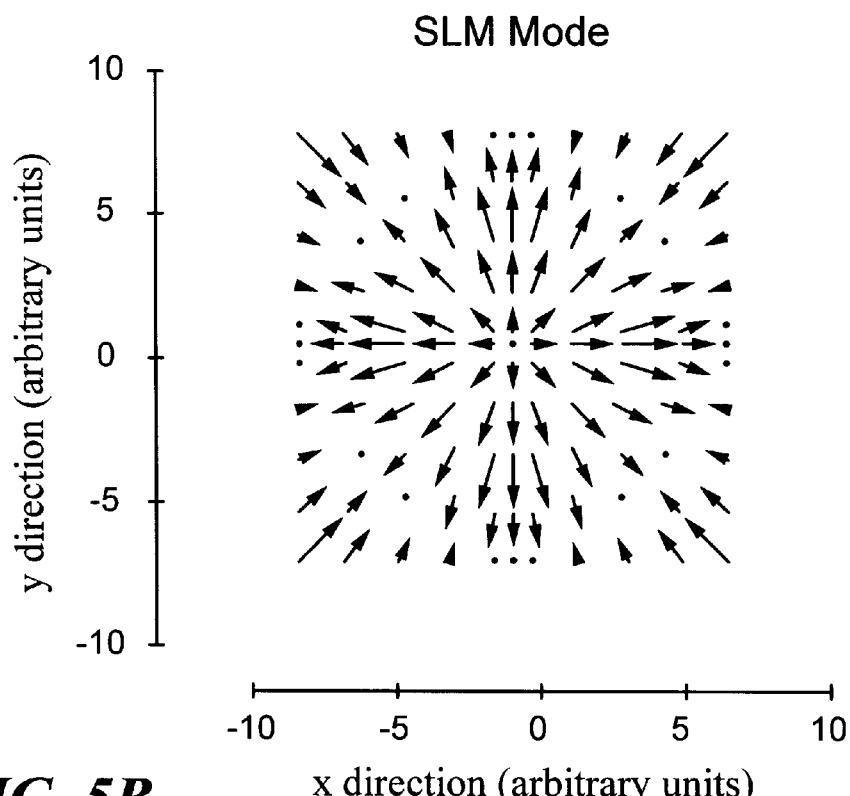
FIG. 5B is a diagram showing calibrated image distortion vs. object height for the optical relay of FIGS. 4A and 4B.

The present arrangement of lenses allows relay 150 to achieve high quality imaging at pixel N.A. up to 0.06 for signal beam 158. The performance of relay 150 in imaging SLM 156 to CCD 172 is generally illustrated by the diagrams in FIGS. 5A and 5B. The wavefront error versus object height in FIG. 5A visualizes the wavefront error across the surface of CCD 172. The circle size indicates pixel spread due to the wavefront error and field curvature. Larger circles indicate lower ensquared energy areas. The diagram of FIG. 5B shows the calibrated image distortion versus object height across the surface of CCD 172. The vectors indicate local image shift. A person of average skill in the art will appreciate that these general wavefront error and image distortion patterns are determined by the lenses used in lens sets 152A and 152B. Other relay designs will generally exhibit different wavefront error and image distortion.

Figure 6:
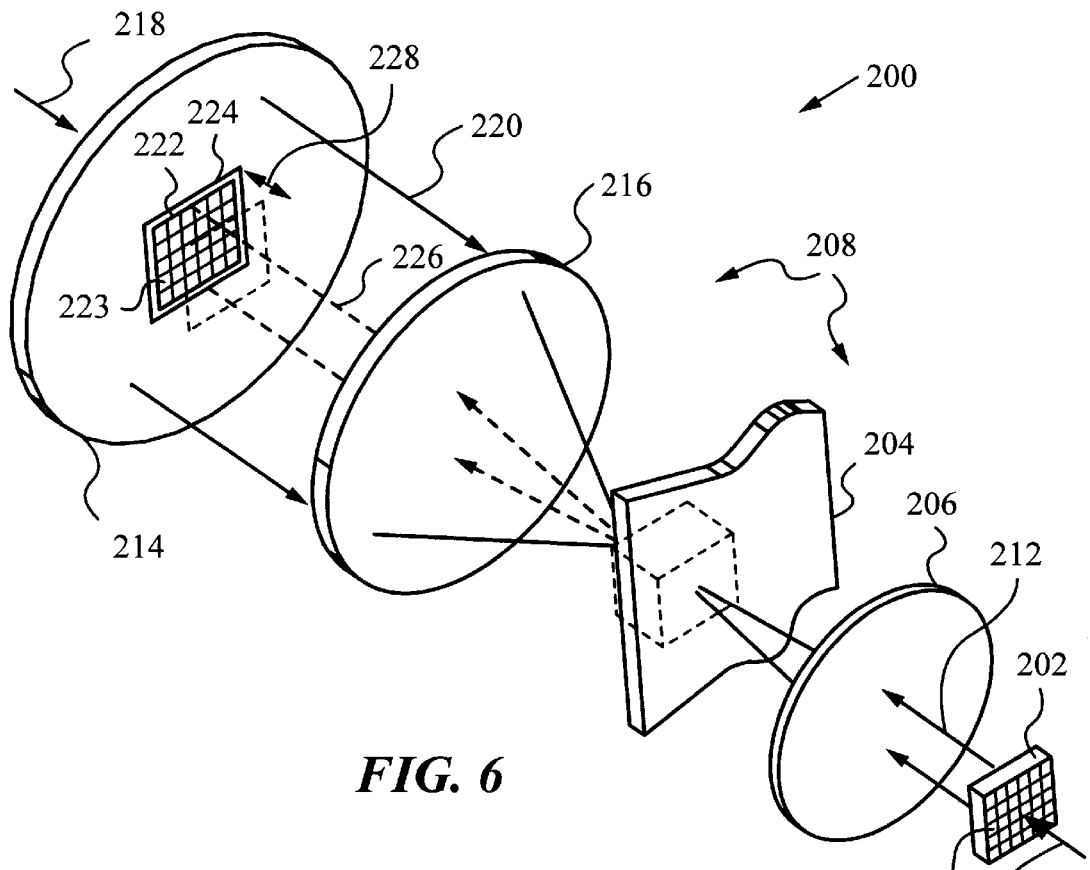
FIG. 6 is an isometric view of another storage and retrieval system according to the invention.

An optical storage and retrieval system 200 adapted for the counter-propagating geometry is illustrated in FIG. 6. Here an SLM 202 is positioned on the right side of a holographic medium 204. In this case holographic medium 204 is a holographic tape. Alternatively, holographic medium 204 may also be a bulk crystal, as indicated in dotted lines.

A lens 206 constituting a part of an optical relay 208 is positioned in front of SLM 202. SLM 202 is illuminated by a coherent light beam 210 from which SLM 202 generates a signal beam 212 encoded with digital information. Lens 206 guides signal beam 212 to medium 204.

A reference generator 214 is positioned on the left side of medium 204 in front of a lens 216 which constitutes the other part of optical relay 208. A detection device 222 is positioned in the center of reference generator. An intermediate region 224 surrounds device 222.

A coherent light beam 218, e.g., derived from the same source as beam 210, illuminates reference generator 214 which derives from the former a reference beam 220. Neither device 222 nor intermediate region 224 transmit beam 218. Hence, reference beam 220 can be an annular beam. Lens 216 guides reference beam 218 to medium 204 where it interferes with signal beam 212 to record a hologram (not shown).

During retrieval the right portion of relay 208 and SLM 202 can be removed. Alternatively, SLM 202 can be blocked. Reference beam 218 impinges on medium 204 to produce reconstructed signal beam 226, which is guided by lens 216 to device 222. The position of device 222 can be adjusted as indicated by arrows 228.

It should be noted that relay 208 of system 200 is not necessarily symmetric and not necessarily 1:1. Additionally, the number of image pixels 223 of detection device 222 can be larger, e.g., by a factor of 4 from the number of object pixels 203 of SLM 202 so as to permit 1:4 oversampling. In this case the imaging criterion imposed on relay 208 is that at least 65% and preferably at least 80% of the nominal luminous energy from each object pixel 203 be ensquared by the corresponding four image pixels 223 of device 222.

System 200 is particularly useful for applications in read-only holographic systems. The recording of holograms can take place in a manufacturing environment and the retrieval can be performed by the end-user. Under these conditions the portion of system 200 required for retrieval of information can be contained in one head.

Figure 7:
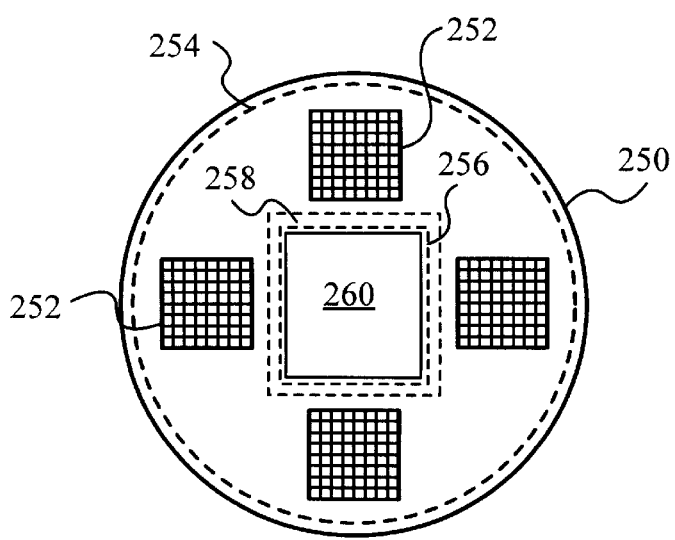
FIG. 7 is a schematic plan view illustrating an alternative arrangement of reference and object regions.

In yet another embodiment an optical recording and retrieval system can be designed to accommodate within a relay's field of view 250 a number of SLMs 252 in an annular object region 254 centered around a reference region 256, as shown in FIG. 7. Reference region 256 is separated from object region 254 by an intermediate region 258 and contains a reference generator 260. In this embodiment reference generator 260 is a cylindrical lens for cylindrical wavefront multiplexing known in the art, particularly suitable for off-axis optimization. The imaging criterion is that at least 65% and preferably 80% of nominal luminous energy from each SLM pixel be ensquared by each corresponding pixel of the detection device; in this case a number of, e.g., CCD devices arranged analogously to SLMs 252 (not shown).

Many alternative embodiments of the invention are possible. In most, it is advantageous to use a 4-f optical relay and record the hologram in the Fourier plane. However, it is also possible to record the hologram in a Fresnel plane.

It will be apparent from the foregoing that, while particular forms of the invention have been illustrated and described, various modifications can be made without departing from the spirit and scope of the invention. Accordingly, it is not intended that the invention be limited, except as determined by the following claims and their legal equivalents.

What is claimed is:

1. A holographic storage and retrieval system comprising:
    a) an object generator positioned in an object region and having object pixels for producing a signal beam, each of said object pixels contributing a nominal luminous energy to said signal beam;
    b) a reference generator positioned in a reference region for producing a reference beam;
    c) a storage medium positioned on an optical axis;
    d) a detection means having image pixels corresponding to said object pixels;
    e) an optical relay for guiding said signal beam and said reference beam along said optical axis to said storage medium to write a hologram, and for guiding a reconstructed signal beam produced by said hologram upon illumination with said reference beam to said detection means;

said optical relay having an object region imaging quality such that at least 65% of said nominal luminous energy from each of said object pixels is ensquared by the corresponding one of said image pixels.

2. The system of claim 1 wherein said object region and said reference region are located in a common plane orthogonal to said optical axis.

3. The system of claim 2 wherein said object region is centered on said optical axis.

4. The system of claim 2 wherein said reference region is spaced a predetermined distance from said optical axis.

5. The system of claim 2 further comprising an intermediate region located between said object region and said reference region.

6. The system of claim 1 wherein at least 80% of said nominal luminous energy from each of said object pixels is ensquared by the corresponding one of said image pixels.

7. The system of claim 1 wherein said object region is located in an object plane orthogonal to said optical axis and said reference region is located in a reference plane orthogonal to said optical axis.

8. The system of claim 7 wherein said object region is centered on said optical axis.

9. The system of claim 7 wherein said reference region is spaced a predetermined distance from said optical axis.

10. The system of claim 1 wherein said object generator is a spatial light modulator.

11. The system of claim 1 wherein the magnification of said optical relay is 1:1.

12. The system of claim 1 wherein said object pixels and said image pixels are substantially equal in area.

13. The system of claim 1 wherein said optical relay has a numerical aperture up to 0.83.

14. The system of claim 1 wherein said object region is contained within a numerical aperture of 0.43.

15. The system of claim 1 wherein said optical relay is a telecentric lens system.

16. The system of claim 1 wherein said optical relay has a pixel numerical aperture equal to approximately 0.04 for said signal beam.

17. The system of claim 1 wherein said reference generator is a light diffuser.

18. The system of claim 1 wherein said object generator and said reference generator are located on opposite sides of said storage medium and said detection means is located on the same side as said reference generator thereby rendering said system counter-propagating.

19. The system of claim 1 wherein said object generator and said reference generator are located on one side of said storage medium and said detection means is located on the opposite side of said storage medium thereby rendering said system co-propagating.

20. The system of claim 1 wherein said detection means is selected from the group of devices consisting of charge coupled devices, semiconductor detector arrays and CMOS detector arrays.

21. The system of claim 1 wherein said medium is selected from the group consisting of disk media, tape media and bulk media.

22. An optical relay for use in an optical storage and retrieval system comprising:
    a) an object generator positioned in an object region and having object pixels for producing a signal beam, each of said object pixels contributing a nominal luminous energy to said signal beam;
    b) a reference generator positioned in a reference region for producing a reference beam; and
    c) a storage medium positioned on an optical axis;
    d) a detection means having image pixels corresponding to said object pixels;
    said optical relay comprising:

a) a lens set arranged along said optical axis for guiding said signal beam and said reference beam along said optical axis to said storage medium to write a hologram of said signal beam and for guiding a reconstructed signal beam to said detection means, said lens set having an object region imaging quality such that at least 65% of said nominal luminous energy from each of said object pixels is ensquared by the corresponding one of said image pixels.

23. The optical relay of claim 22 wherein at least 80% of said nominal luminous energy from each of said object pixels is ensquared by the corresponding one of said image pixels.

24. The optical relay of claim 22 wherein said lens set is a Double Fourier Transform Relay centered on said storage medium.

25. The optical relay of claim 22 wherein said lens set has a numerical aperture approximately up to 0.83.

26. The optical relay of claim 25 wherein said object region is contained within a numerical aperture of 0.43.

27. The system of claim 22 wherein said optical relay has a pixel numerical aperture equal to approximately 0.04 for said signal beam.

28. The system of claim 22 wherein said optical relay has a numerical aperture more than 0.08 for said reference beam.

29. The optical relay of claim 22 wherein said holographic medium is selected from the group consisting of disk media, tape media and bulk media.

30. The optical relay of claim 22 wherein said lens set has a 1:1 magnification.

31. The optical relay of claim 22 wherein said lens set comprises a 4f telecentric arrangement.

32. The optical relay of claim 22 wherein said storage medium is located outside the Fourier plane of said optical relay and said optical relay further comprises a compensating plate for compensating imaging distortions and aberration and for keeping said optical relay symmetric.

33. A holographic storage and retrieval system comprising:
 a) an object generator positioned in an object region and having object pixels for producing a signal beam, each of said object pixels contributing a nominal luminous energy to said signal beam;
 b) a reference generator positioned in a reference region for producing a reference beam;
 c) a storage medium positioned on an optical axis;
 d) a detection means having image pixels corresponding to said object pixels;
 e) an optical relay for guiding said signal beam and said reference beam along said optical axis to said storage medium to write a hologram, and for guiding a reconstructed signal beam produced by said hologram upon illumination with said reference beam to said detection means;
 said optical relay having an object region imaging quality such that at least 65% of said nominal luminous energy from each of said object pixels is ensquared by the corresponding one of said image pixels; and
 said optical relay having a numerical aperture up to 0.83.

34. The system of claim 33 wherein said object region is contained within a numerical aperture of 0.43.

35. A holographic storage and retrieval system comprising:
 a) an object generator positioned in an object region and having object pixels for producing a signal beam, each of said object pixels contributing a nominal luminous energy to said signal beam;
 b) a reference generator positioned in a reference region for producing a reference beam;
 c) a storage medium positioned on an optical axis;
 d) a detection means having image pixels corresponding to said object pixels;
 e) an optical relay for guiding said signal beam and said reference beam along said optical axis to said storage medium to write a hologram, and for guiding a reconstructed signal beam produced by said hologram upon illumination with said reference beam to said detection means;
 said optical relay having an object region imaging quality such that at least 65% of said nominal luminous energy from each of said object pixels is ensquared by the corresponding one of said image pixels: and
 wherein said optical relay has a pixel numerical aperture equal to approximately 0.04 for said signal beam.

36. An optical relay for use in an optical storage and retrieval system comprising:
 a) an object generator positioned in an object region and having object pixels for producing a signal beam, each of said object pixels contributing a nominal luminous energy to said signal beam;
 b) a reference generator positioned in a reference region for producing a reference beam; and
 c) a storage medium positioned on an optical axis;
 d) a detection means having image pixels corresponding to said object pixels;
 said optical relay comprising:
 a) a lens set arranged along said optical axis for guiding said signal beam and said reference beam along said optical axis to said storage medium to write a hologram of said signal beam and for guiding a reconstructed signal beam to said detection means, said lens set having an object region imaging quality such that at least 65% of said nominal luminous energy from each of said object pixels is ensquared by the corresponding one of said image pixels; and
 said lens set having a numerical aperture approximately up to 0.83.

37. The optical relay of claim 36 wherein said object region is contained within a numerical aperture of 0.43.

38. An optical relay for use in an optical storage and retrieval system comprising:
 a) an object generator positioned in an object region and having object pixels for producing a signal beam, each of said object pixels contributing a nominal luminous energy to said signal beam;
 b) a reference generator positioned in a reference region for producing a reference beam; and
 c) a storage medium positioned on an optical axis;
 d) a detection means having image pixels corresponding to said object pixels;
 said optical relay comprising:
 a) a lens set arranged along said optical axis for guiding said signal beam and said reference beam along said optical axis to said storage medium to write a hologram of said signal beam and for guiding a reconstructed signal beam to said detection means, said lens set having an object region imaging quality such that at least 65% of said nominal luminous energy from each of said object pixels is ensquared by the corresponding one of said image pixels; and
 wherein said optical relay has a pixel numerical aperture equal to approximately 0.04 for said signal beam.

39. An optical relay for use in an optical storage and retrieval system comprising:

a) an object generator positioned in an object region and having object pixels for producing a signal beam, each of said object pixels contributing a nominal luminous energy to said signal beam;

b) a reference generator positioned in a reference region for producing a reference beam; and c) a storage medium positioned on an optical axis;

d) a detection means having image pixels corresponding to said object pixels;

said optical relay comprising:

a) a lens set arranged along said optical axis for guiding said signal beam and said reference beam along said optical axis to said storage medium to write a hologram of said signal beam and for guiding a reconstructed signal beam to said detection means, said lens set having an object region imaging quality such that at least 65% of said nominal luminous energy from each of said object pixels is ensquared by the corresponding one of said image pixels; and wherein said optical relay has a numerical aperture more than 0.08 for said reference beam.

* * * * *